United States Patent [19]
Pack, Sr.

[11] 3,993,505
[45] Nov. 23, 1976

[54] INTERCONNECTOR FOR COMPONENTS SUCH AS SOLAR CELLS OR THE LIKE

[75] Inventor: George J. Pack, Sr., Los Angeles, Calif.

[73] Assignee: Hughes Aircraft Company, Culver City, Calif.

[22] Filed: May 27, 1975

[21] Appl. No.: 581,020

[52] U.S. Cl. ............................... 136/89; 174/86; 338/316; 339/9 E; 339/278 A
[51] Int. Cl.² ...................... H01L 31/02; H01R 5/02
[58] Field of Search.............. 174/86, 69, 13, 126 R, 174/126 CP, 126 CS, 99 E; 339/9 R, 9 E, 256 R, 258 R, 258 P, 222, 278 R, 17 T, 275 C, 277 R, 277 C, 278 A; 338/316, 293, 206, 283–285, 287–293, 295, 328, 330, 333; 267/181; 136/206, 242, 89

[56] References Cited
UNITED STATES PATENTS

| | | | |
|---|---|---|---|
| 846,969 | 3/1907 | Wohl ............................... 338/293 X |
| 2,084,556 | 6/1937 | Hamilton ........................... 338/206 |
| 2,640,861 | 6/1953 | Kremers........................ 338/293 UX |
| 2,678,685 | 5/1954 | Volsk ............................ 267/181 UX |
| 2,680,184 | 6/1954 | Cox ................................ 338/292 X |
| 3,408,608 | 10/1968 | Chikinev............................ 338/316 |
| 3,459,597 | 8/1969 | Baron ................................. 136/89 |
| 3,575,721 | 4/1971 | Mann................................... 136/89 |
| 3,637,957 | 1/1972 | Janzow et al.................. 174/99 E X |
| 3,819,417 | 6/1974 | Haynos ................................ 136/89 |
| 3,837,924 | 9/1974 | Baron ................................. 136/89 |
| 3,874,931 | 4/1975 | Haynos ................................ 136/89 |

FOREIGN PATENTS OR APPLICATIONS

| | | | |
|---|---|---|---|
| 420,027 | 10/1925 | Germany ........................... 338/293 |
| 486,243 | 11/1929 | Germany ........................... 338/293 |
| 392,549 | 5/1933 | United Kingdom................. 338/288 |

*Primary Examiner*—Laramie E. Askin
*Attorney, Agent, or Firm*—Noel B. Hammond; W. H. MacAllister

[57] ABSTRACT

A thin conductive sheet having elongated openings extending inward from the edges to define a connecting arm extending from one end of one connecting surface to the diagonally opposite end of a second connecting surface. In one embodiment, the connecting arm extends directly from one corner to the diagonally opposite corner. In a second embodiment, the connecting arm changes direction to define a generally Z-shaped, reverse diagonal connecting path. Ties are provided across the elongated openings to hold the interconnector together during assembly, but which later break to permit the elongated openings to open up to define the connecting arm. One or more slits may be provided in the connecting arm to reduce buckling out of plane. The interconnector may be chrome plated in the central area to keep solder from flowing into the elongated openings and slits. To minimize the stress transition from the plated to the unplated portion, the plating terminates in a sine-wave-like wavy line which is 180° out of phase with the corresponding wavy line on the reverse side.

11 Claims, 5 Drawing Figures

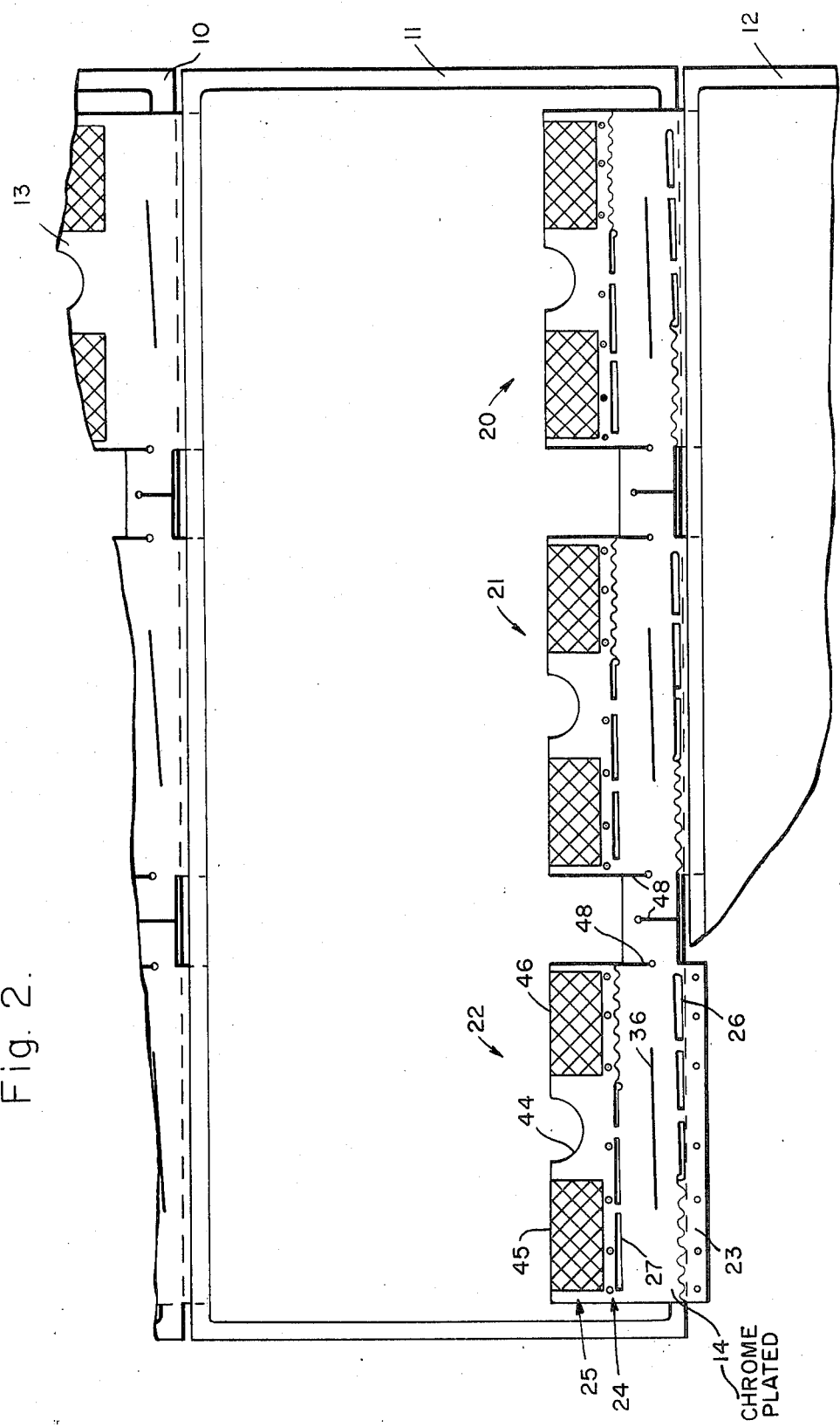

INTERCONNECTOR FOR COMPONENTS SUCH AS SOLAR CELLS OR THE LIKE

FIELD OF THE INVENTION

The present invention relates to arrays of components such as solar cells, or the like, and more particularly, to an improved interconnector for making the interconnections between individual components making up the arrays.

BACKGROUND OF THE INVENTION

In arrays of components such as solar cells or the like, relatively large displacements can occur between the components due to vibration and thermal stresses to which the arrays are subjected. These displacements may occur in any direction. Prior art interconnectors tend to break or tear during large amplitude displacements of the components. Even prior art interconnectors made of a mesh or having diamond shaped holes or provided with a fold or loop of extra material are unsatisfactory for large displacements. Also, the design of the interconnectors should be compatible with use in conventional automatic array assembly machines. Some prior art interconnectors are made in intricate designs of curved conductors having many tabs that must be soldered or welded. Such intricate interconnectors are so difficult to hold and position that automatic assembly is very complex. At present, they can only be soldered or welded manually.

Accordingly, it is an object of the present invention to provide an interconnector that will not break or tear during large amplitude displacements of the components which it interconnects.

Another object of the invention is the provision of an interconnector which presents an acceptable value of electrical resistance to the flow of current.

A further object of the present invention is to provide an interconnector which is compatible with use in conventional automatic assembly machines.

SUMMARY OF THE INVENTION

In accordance with these and other objects of the invention, instead of using a vertical loop or folds of extra material which extend vertically to provide slack in the interconnector, as is done in the prior art, the extra expansion length is provided by modifying the interconnector so that some expansion modes take place in an orthogonal plane. In a first embodiment of the invention, the interconnector has a long, generally diagonal arm or connecting path of thin metal foil which extends from one corner to the diagonally opposite corner. When the components move apart, the ends of the arm rotate as it tends to try to extend straight across between the two components. Also, the arm lengthens by stretching because it is under tension. Due to a resulting torque, the arm goes out of plane (or buckles). To reduce the amount of this buckling out of plane, at least one slit is provided in the center of the arm. This, in effect, provides multiple parallel arms, each of which buckles slightly, but the amount of buckling is less than with a single arm. The symmetrical, generally rectangular configuration of the overall interconnector makes it compatible with being used in automatic assembly machinery.

Another feature of the invention is that when the interconnectors are to be soldered, rather than welded, the central portion of the interconnector is chrome plated in a manner that avoids a sharp stress transition line between the plated and unplated portions. The chrome plating is to keep the solder from filling the slits and notches, and generally covers the surface of the interconnector, but not the connecting surfaces that are soldered to the components. To avoid having a sharp stress transition line between the plated and unplated portions, the plating terminates in a wavy line similar to a sine wave, and the plating on the reverse side terminates in a similar wavy line, except that the two wavy lines are 180° out of phase. This tends to give a gradual transition in the equivalent Young's Modulus from the plated to the unplated surface.

In a second embodiment of the invention, the interconnector has the basic diagonal arm at a reverse angle. The connecting path extends from a corner on a first side directly toward one corner of the second side, and then without connecting with the second side at that point, diagonally angles back toward the other corner of the first side, and without connecting with the first side at that point, extends directly to the other corner of the second side, making contact therewith. This embodiment is useful where a longer displacement is required. The connecting arm is at a reverse angle so that as the components move apart, the arm is in compression rather than tension. That is, the rotation of the diagonal arm initially tends to squeeze the ends of the arm together.

BRIEF DESCRIPTION OF THE DRAWINGS

The foregoing and other objects and features of the present invention can be more readily understood with reference to the following detailed description taken in conjunction with the accompanying drawings, wherein like reference numerals designate like structural elements, and in which

FIG. 2 is a plan view of the bottom of the interconnected solar cells of FIG. 1 showing the configuration of the interconnectors;

DETAILED DESCRIPTION OF THE INVENTION

At the outset, it should be clearly understood that although the invention is described with reference to the interconnection of solar cells by way of example, the invention is not limited to space applications, nor even to the interconnection of solar cells. The invention has application to the interconnection of any closely spaced components that are subject to large multidirectional displacement.

Figure 1:
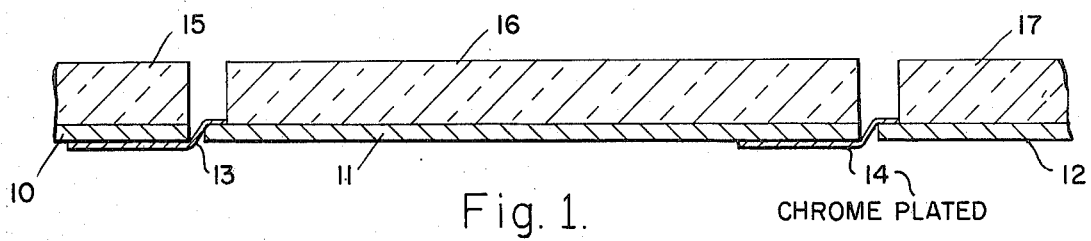
FIG. 1 is a greatly enlarged side view in cross-section of three solar cells interconnected by interconnectors of the present invention.

FIG. 1 shows three solar cells 10, 11 and 12 interconnected with improved interconnectors 13, 14 constructed in accordance with the present invention. Each solar cell 10, 11 and 12 is 2 × 6 cm. and has a cover glass 15, 16 and 17 which covers all but a connecting surface. The interconnectors 13, 14 are soldered or welded to the solar cells 10, 11 and 12 in an over-under configuration. Interconnector 14 is fastened to the bottom of solar cell 11 at one edge, and to the connecting surface on the top of solar cell 12.

It should be understood that although the invention is illustrated as making an over-under connection from the bottom of one component to the top of another, it may also be used for a straight-across connection. That is, it may make a connection from the top of one component to the top of another, or from the bottom of one component to the bottom of another. Also, although the solar cells illustrated here are 2 × 6 cm., the interconnector of the present invention may also be employed with solar cells having other dimensions such as 2 × 2 cm. for example.

The solar cells 10, 11 and 12 are subject to relative motion with respect to each other due to vibration and thermal stresses. The motion may be multidirectional, that is they may tend to move apart, toward the left and right as seen in FIG. 1, or up and down, or laterally into and out of the paper, as seen in FIG. 1. The interconnectors 13 and 14 of the present invention accommodate larger amounts of such relative motion or displacement than prior art interconnectors.

Referring now to FIG. 2, there is shown the bottom of the solar cells 10, 11 and 12, and a more detailed view of the interconnectors 13, 14. It will be seen that the interconnectors 13, 14 comprise three repeating similar sections indicated generally at 20, 21, 22, all joined together in a line. These sections 20, 21, 22 may be cut apart and used individually in some applications, as for example to interconnect 2 × 2 cm. solar cells.

The interconnectors 13, 14 are made of a thin conductive sheet of silver, copper, aluminum or the like on the order of 1 or 2 mils thick. One edge of interconnector 14 is connected to the upper conductive edge of solar cell 12 in the area indicated generally by the numeral 23. A portion of solar cell 12 is shown broken away so that the tab or connecting surface 23 of section 22 of interconnector 14 may be seen.

The joint may be either soldered or welded. If it is soldered, the connecting surface 23 is first plated on each side with solder, tin or the like to a suitable thickness which may be on the order of approximately 0.1 to 0.3 mils. The other connecting surface of interconnector 14 is fastened to the back of solar cell 11 in the area indicated generally by the numeral 24. The area of interconnector 14 indicated by the numeral 25 is, in general, unnecessary, but if the interconnector 14 is soldered to the solar cell 11, the solder may also flow in the area 25.

Figure 4:
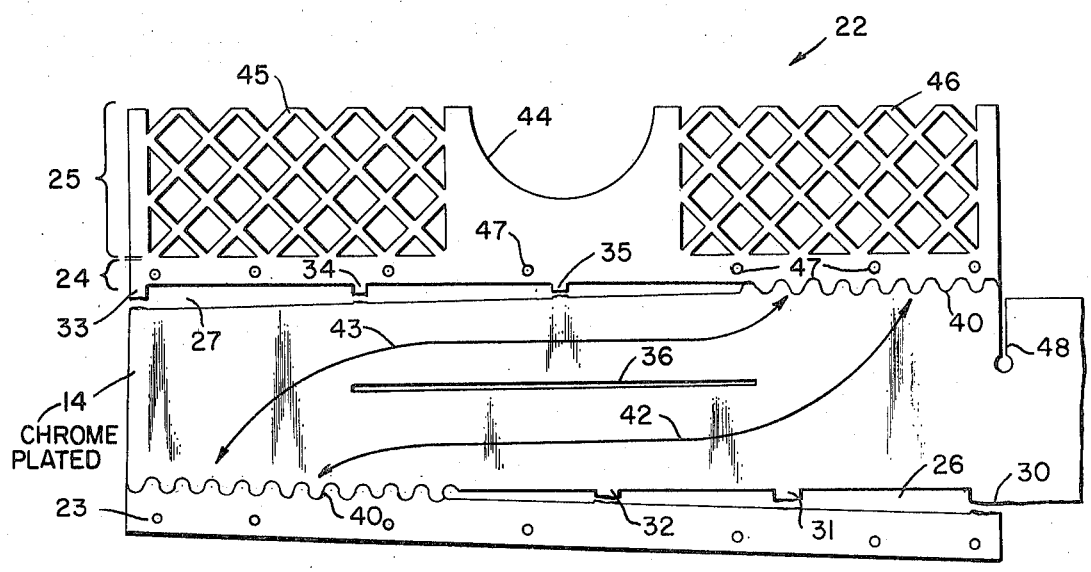
FIG. 4 is another view of the portion of the interconnector of FIG. 3 showing the ties broken to open up the slots and the diagonal path.

Section 22 of interconnector 14 is provided with two narrow angular notches 26, 27 that extend from opposite edges of the interconnector 14 and past the center thereof. The outer edges of these notches 26, 27 extend parallel to the connecting surfaces 23, 24 while the inner edges of the notches 26, 27 are angled a few degrees with respect thereto. Ties 30, 31 and 32 (best seen in FIG. 3) are provided on notch 26 to hold the interconnector 14 together while it is being soldered to the solar cells 11, 12. These ties 30–32 are later intentionally permitted to be broken as shown in FIG. 4. Similar ties 33, 34 and 35 are provided in notch 27.

The ties 30–35 are made weaker than any other part of the interconnector 14 so that they will be sure to break. If the ties 30–35 do not break as the solar cells 11, 12 move apart, the solar cells 11, 12 themselves may break.

When the notches 26, 27 are opened, section 22 of interconnector 14 becomes a long, generally diagonal, connecting path or arm extending from one corner at solar cell 12 to the opposite corner at solar cell 11. It is this diagonal path that permits the large expansion length of interconnector 14 when the solar cells 11, 12 move apart. There is a rotation at each end of the diagonal path as the diagonal path tends to extend straight across between the cells 11, 12. The diagonal path stretches to some degree because the diagonal path is in tension as the solar cells 11, 12 move apart. This stretching is acceptable as long as the elastic limit of the material is not exceeded.

After the ties 30–35 are broken, the electrical path is diagonally from one corner of section 22 to the other corner. Thus not all of the connecting surfaces 23, 24 is being used to make either the mechanical or the electrical connections between the solar cells 11, 12, and the part that is not being used could be eliminated, if desired. However, the uniform, generally rectangular, configuration of the interconnector 14 makes it more suitable for use in automatic assembling machines. Furthermore, if the unnecessary portions of the connecting surfaces 23, 24 are left soldered to the solar cells 11, 12, if there is any cracking or breakage of the solar cells 11, 12, the connecting surfaces 23, 24 will hold the broken pieces together and permit each broken piece to continue to contribute power to the solar array.

As the solar cells 11, 12 move apart and the diagonal path begins to change its position with rotation at each end, the diagonal path tends to buckle and rotate out of plane. In order to reduce the amount of buckling, a slit 36 is made in the middle of the diagonal path, which splits the path into two parallel portions. Each of the paths now has some buckling, but they do not go out of plane as much as a single diagonal path does. More than one slit may be used to provide more than two parallel paths and correspondingly reduce the amount of buckling even more in each path.

Because of this buckling, the solar cells 11, 12 must be spaced away from the substrate to which they are mounted by one or two thousandths of an inch to permit room for the interconnector 14 to go out of plane. Ordinarily this is accomplished by cementing the solar cells 11, 12 to the substrate with a resilient room temperature vulcanizing rubber cement. The cement holds the solar cells 11, 12 away from the substrate and permits movement of the cells 11, 12 and the going out of plane of the interconnector 14.

The interconnectors 13, 14 may be made by any conventional technique such as punching, etching, plating or the like.

Figure 3:
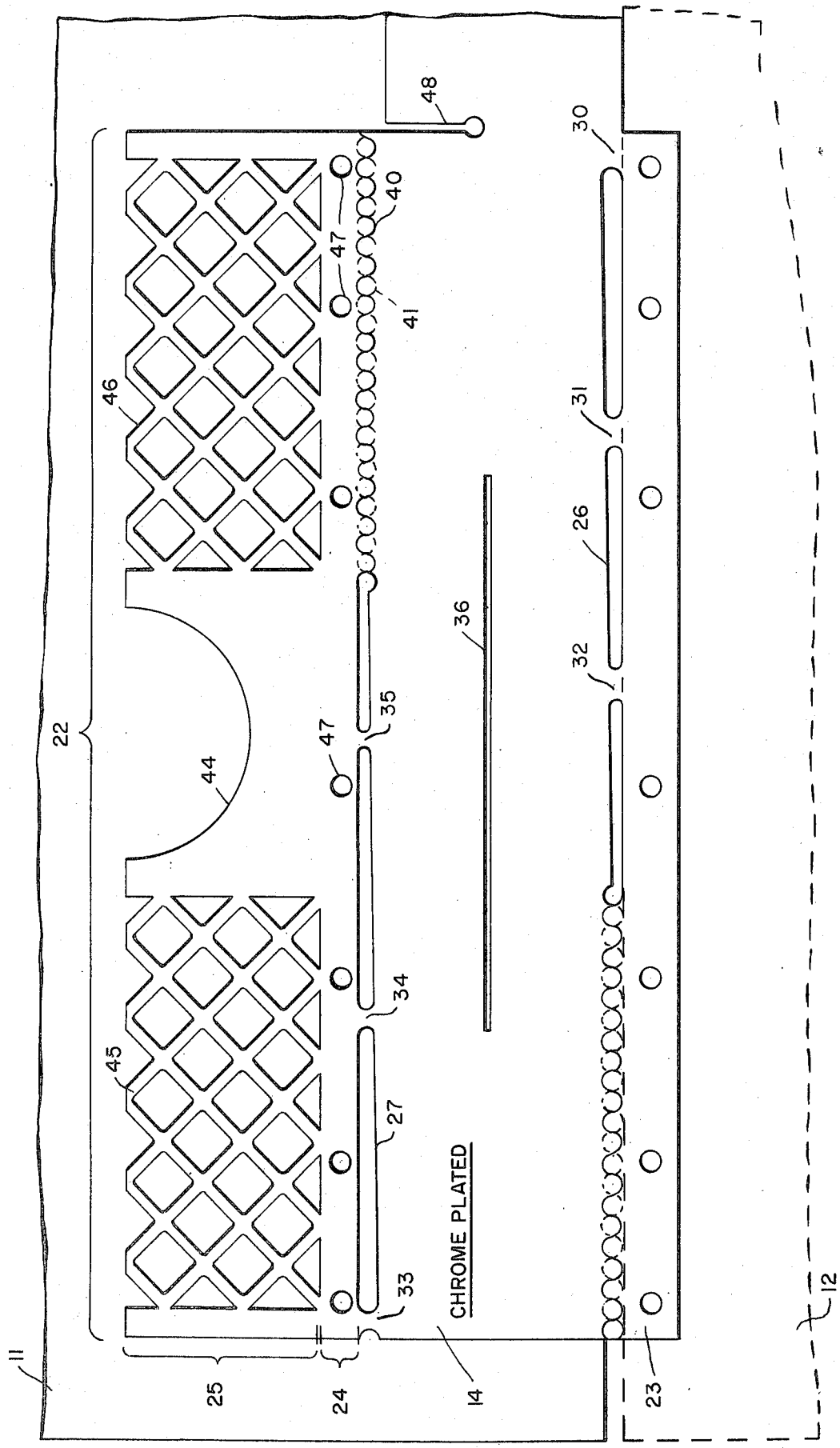
FIG. 3 is an enlarged view of one portion of the interconnector of FIG. 2 showing construction details thereof.

FIG. 3 shows section 22 of interconnector 14 enlarged so that more detail may be seen. When interconnector 14 is to be soldered rather than welded, the central portion of the interconnector 14 is chrome plated in a manner that avoids a sharp stress transition line between the plated and unplated portions. The chrome plating is to keep the solder from filling the notches 26, 27 and the slit 36, and generally covers the surface of the interconnector 14 which extends between the connecting surfaces 23, 24, but the chrome plating does not extend into the connecting surfaces 23, 24 that are soldered to the solar cells 11, 12. To avoid having a sharp stress transition line between the plated and unplated portions which would weaken the interconnector 14 and make it tend to break at that transition line, the plating terminates in a wavy line 40 similar to a sine wave. The plating on the reverse side of interconnector 14 terminates in a similar wavy line 41. The two wavy lines 40, 41 are 180° out of phase. This tends to give a gradual transition in the Young's modulus from the plated to the unplated surface.

FIG. 4 is another view of section 22 of interconnector 14 showing the ties 30–35 broken to open up the notches 26, 27. This is the normal condition for interconnector 14 after it is in operation. Note that with the angular notches 26, 27, interconnector 14 connects the two solar cells 11, 12 along the generally diagonal path or paths indicated by the two arrows 42, 43.

The area of interconnector 14 indicated by the numeral 25 is, in general, unnecessary and may be removed. However, when the interconnector 14 is used in conventional automatic solar cell array assembly machines, some means for aligning the interconnector is needed, and in this example the semicircular cutout 44 may be used for positioning the interconnector 14 in the cutting machine and in the automatic soldering machine, although other alignment techniques may be used. The machine catches the interconnector 14 in the hole 44 and pushes it down into the shear. Another feature which makes the interconnector 14 compatible with use in automatic solar cell assembly machines is the long connecting surfaces 23, 24. These make the interconnector 14 easy to hold, slice, manipulate and solder or weld.

The diamond shaped meshes 45, 46 facilitate soldering the interconnector 14 to the solar cell 11. The solder readily flows into the diamong shaped holes because it has a good capillary action. The strips in the mesh 45, 46 have to be very thin or fine in dimensions because if they are too large then tend to cause the solar cell 11 to crack. Another feature which facilitates soldering is the provision of a series of tiny holes 47 along the connecting surfaces 23, 24. Furthermore, connecting surface 23 may be provided with a series of small notches along the edge, if so desired, to facilitate soldering.

Another feature of the holes 47 or notches is that they tend to compensate for stresses due to differences in the coefficients of expansion. When the assembly is heated or cooled, the solar cells 11, 12 expand or contract at a different rate than the interconnector 14, which tends to cause the solar cells 11, 12 to crack, as they are very brittle. The holes 47, in effect, break up the connecting surfaces 23, 24 into a series of short segments that break up the stresses and permit expansion.

Slots 48 which terminate in small holes are provided between the sections 20, 21, 22 of the interconnector 14 to permit it to flex sidewards. They tend to compensate for differential temperature expansion. The solar cells 11, 12 and the interconnector 14 have different rates of expansion, and the slots 48 which terminate in little holes tend to allow for that. Furthermore, if the interconnector 14 is employed to interconnect 2 × 2 cm. solar cells, the slots 48 permit sideward movement between the cells.

Figure 5:
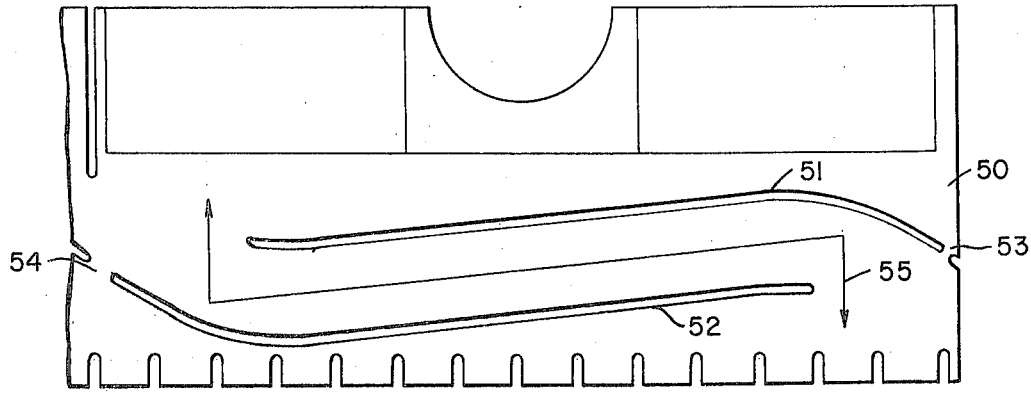
FIG. 5 is a view of a portion of a second embodiment of an interconnector having a compression mode reverse diagonal connecting arm.

The embodiment of FIGS. 2–4 has a diagonal connecting path which provides a large expansion length interconnector. However, when an even longer displacement is required, the embodiment shown in FIG. 5 may be used. This second embodiment employs a connecting path which goes into compression initially instead of tension when the solar cells are displaced because it is a reverse diagonal. The compression interconnector 50 is provided with slots 51, 52 of a curved, generally S-shaped configuration which are not parallel with the edges of the connector 50. These slots 51, 52 have toes 53, 54 that when broken result in a connecting path indicated generally by the arrow 55 which forms a diagonal that doubles back on itself. That is to say the path starts out from the corner of the first side and starts directly across the interconnector 50, and then heads diagonally back for the other corner of the first side, and then heads directly back to the diagonal corner of the second side. No central slit is provided, as it is not needed due to the fact that this interconnector 50 does not rotate out of plane a large amount. Due to compression, it does develop wrinkles or folds. When the cells are pulled apart, the rotation is such that it tends to squeeze the diagonal arm together so that it is under compression. As the movement continues, the diagonal arm rotates until it begins to come out of compression, and finally it too will go into tension as in the first embodiment if the displacement continues.

Thus there have been described several embodiments of an interconnector having a large expansion length so that it will not break or tear during large amplitude displacements of the components which it interconnects. It presents a low electrical resistance to the flow of current, and provides a large expansion length and is compatible with use in conventional automatic assembly machines.

It is to be understood that the above described embodiments of the invention are merely illustrative of the many possible specific embodiments which represent applications of the principles of the present invention. Numerous and varied other arrangements can be readily devised in accordance with these principles by those skilled in the art without departing from the spirit and scope of the invention.

What is claimed is:
1. An interconnector for components comprising:
a generally rectangular, thin conductive sheet;
said sheet having first and second connecting surfaces extending along two opposite edges thereof for fastening to components;
said sheet having first and second elongated openings extending inward from the other two opposite edges thereof adjacent said connecting surfaces to define a connecting path extending generally from one end of said first connecting surface to the diagonally opposite end of said second connecting surface;
all of said sheet except said connecting surfaces being chrome plated, the junction between the plated areas and the unplated areas terminating in a first sine wave like line on one side of said interconnector, and terminating in a second sine wave like line on the other side of said interconnector, said first and second sine wave like lines overlying each other and being nominally 180° out of phase.

2. An interconnector for components comprising:
a generally rectangular, thin conductive sheet;
said sheet having first and second connecting surfaces extending along two opposite edges thereof for fastening to components;
said sheet having first and second elongated openings extending inward from the other two opposite edges thereof adjacent said connecting surfaces to define a connecting path extending generally from one end of said first connecting surface to the diagonally opposite end of said second connecting surface;

said elongated openings being provided with ties extending thereacross, said ties being easily breakable to open said elongated openings when said connecting surfaces begin to move apart.

3. An electrical interconnector for components comprising:

a generally rectangular piece of thin conductive metal foil defining an interconnector;

said interconnector having first and second elongated connecting surfaces extending along two opposite edges thereof for fastening to components;

said interconnector having first and second elongated openings extending inward from the other two opposite edges thereof adjacent said connecting surfaces to define a connecting path extending generally from one end of said first connecting surface to the diagonally opposite end of said second connecting surface;

said elongated openings changing direction to define a generally Z-shaped reverse diagonal connecting path which extends from one end of said first connecting surface toward the same end of said second connecting surface, changes direction to extend generally diagonally toward the other end of said first connecting surface, and changes direction again to extend toward the other end of said second connecting surface, said connecting path initially being under compression as it rotates when said connecting surfaces are moved away from each other, further displacements removing the compression from said path, the displacement of said connecting surfaces finally being limited by tension in said connecting path.

4. An electrical interconnector for components comprising:

a generally rectangular piece of thin conductive metal foil defining an interconnector;

said interconnector having first and second elongated connecting surfaces extending along two opposite edges thereof for fastening to components;

said interconnector having first and second elongated openings extending inward from the other two opposite edges thereof adjacent said connecting surface to define a connecting path extending generally from one end of said first connecting surface to the diagonally opposite end of said second connecting surface;

all of said interconnector except said connecting surfaces being chrome plated, the junction between the plated areas and the unplated areas terminating in a first sine wave like line on one side of said interconnector, and terminating in a second sine wave like line on the other side of said interconnector, said first and second sine wave like lines overlying each other and being nominally 180° out of phase.

5. An electrical interconnector for components comprising:

a generally rectangular piece of thin conductive metal foil defining an interconnector;

said interconnector having first and second elongated connecting surfaces extending along two opposite edges thereof for fastening to components;

said interconnector having first and second elongated openings extending inward from the other two opposite edges thereof adjacent said connecting surfaces to define a connecting path extending generally from one end of said first connecting surface to the diagonally opposite end of said second connecting surface;

said elongated openings being provided with ties extending thereacross, said ties being easily breakable to open said elongated openings when said connecting surfaces begin to move apart.

6. A solar cell array comprising:

first and second solar cells each having a bottom surface defining a bottom electrode, and a conductive strip extending along a top edge defining a top electrode;

a generally rectangular piece of thin conductive metal foil defining an interconnector;

said interconnector having first and second elongated connecting surfaces extending along two opposite edges thereof, said first connecting surface being connected to the bottom electrode of said first solar cell, and said second connecting surface being connected to the top electrode of said second solar cell;

said interconnector having first and second elongated openings extending inward from the other two opposite edges thereof adjacent said connecting surfaces to define a connecting path extending generally from one end of said first connecting surface to the diagonally opposite end of said second connecting surface.

7. The solar cell array of claim 6 in which said elongated openings in said interconnector are notches extending generally parallel to said connecting surfaces to define a generally diagonal connecting path which rotates when said connecting surfaces are moved away from each other, and is finally limited by tension during large displacements of said connecting surfaces.

8. The solar cell array of claim 7 in which at least one slit is provided in said connecting path of said interconnector to define multiple parallel connecting paths.

9. The solar cell array of claim 6 in which said elongated openings in said interconnector change direction to define a generally Z-shaped reverse diagonal connecting path which extends from one end of said first connecting surface toward the same end of said second connecting surface, changes direction to extend generally diagonally toward the other end of said first connecting surface, and changes direction again to extend toward the other end of said second connecting surface, said connecting path initially being under compression as it rotates when said connecting surfaces are moved away from each other, further displacements removing the compression from said path, the displacement of said connecting surfaces finally being limited by tension in said connecting path.

10. The solar cell array of claim 6 in which all of said interconnector except said connecting surfaces is chrome plated, the junction between the plated areas and the unplated areas terminating in a first sine wave like line on one side of said interconnector, and terminating in a second sine wave like line on the other side of said interconnector, said first and second sine wave like lines overlying each other and being nominally 180° out of phase.

11. The solar cell array of claim 6 in which said elongated openings in said interconnector are provided with ties extending thereacross, said ties being easily breakable to open said elongated openings when said connecting surfaces begin to move apart.

* * * * *